(12) United States Patent
Haroun et al.

(10) Patent No.: US 9,692,356 B2
(45) Date of Patent: Jun. 27, 2017

(54) OSCILLATOR FREQUENCY TUNING USING BULK ACOUSTIC WAVE RESONATOR

(71) Applicant: Texas Instruments Incorporated, Dallas, TX (US)

(72) Inventors: Baher S. Haroun, Allen, TX (US); Ali Kiaei, San Jose, CA (US); Kai Yiu Tam, Santa Clara, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/947,424

(22) Filed: Nov. 20, 2015

(65) Prior Publication Data

US 2017/0149386 A1   May 25, 2017

(51) Int. Cl.
*H03B 5/36* (2006.01)
*H03L 1/02* (2006.01)

(52) U.S. Cl.
CPC ............. *H03B 5/364* (2013.01); *H03L 1/02* (2013.01)

(58) Field of Classification Search
CPC ............. H03B 5/364; H03B 5/04; H03L 1/02
USPC .......................................... 331/60, 176, 66
See application file for complete search history.

(56) References Cited

U.S. PATENT DOCUMENTS

2009/0146746 A1* 6/2009 Unkrich ................ H03L 1/022
                                                              331/70

* cited by examiner

*Primary Examiner* — Joseph Chang
(74) *Attorney, Agent, or Firm* — John R. Pessetto; Charles A. Brill; Frank D. Cimino

(57) ABSTRACT

The systems and methods of oscillator frequency tuning using a bulk acoustic wave resonator include a relaxation oscillator, a BAW oscillator, a frequency counter, and an adjustment module. The BAW oscillator provides an accurate time reference even over temperature changes. The BAW oscillator is turned on periodically and the relaxation oscillator is calibrated with the BAW oscillator. A temporary and periodic enablement of the BAW oscillator maintains a low current consumption. The frequency counter counts a number of full periods of the BAW oscillator that occur in one period of the relaxation oscillator. Since each frequency is known, the number of pulses of the BAW oscillator that should occur during one period of the relaxation oscillator is known. If the count is different from what should be counted, a correction may be made by adjusting an input parameter of the relaxation oscillator.

20 Claims, 6 Drawing Sheets

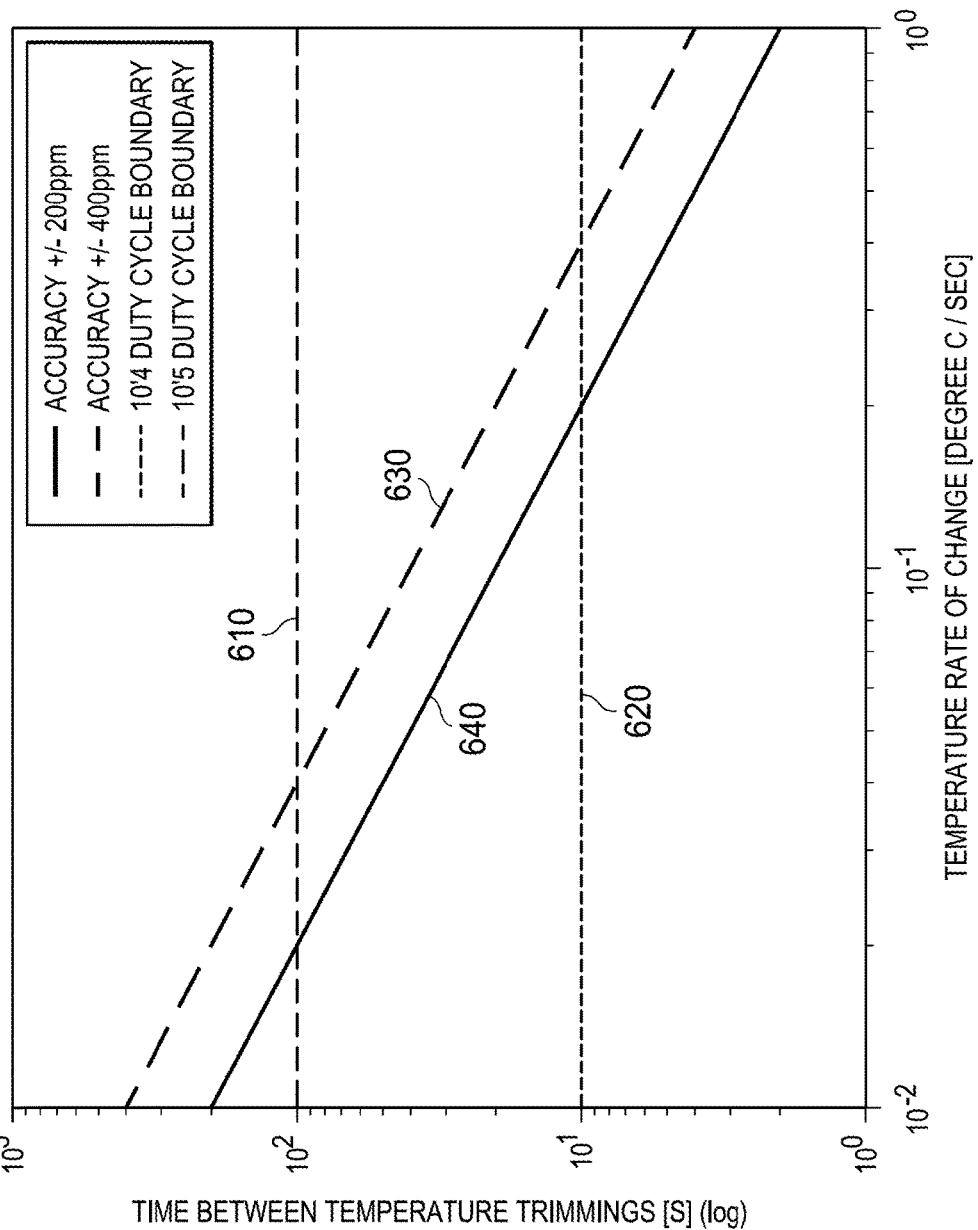

OSCILLATOR FREQUENCY TUNING USING BULK ACOUSTIC WAVE RESONATOR

TECHNICAL FIELD

The present disclosure is generally related to electronics and, more particularly, is related to oscillation signal generation.

BACKGROUND

Relaxation or resistor/capacitor (RC oscillators are built from resistors, capacitors and at least one comparator. They are typically low cost and have a shorter startup time than a crystal oscillator, but variations in component values over temperature make it difficult to precisely regulate the oscillation frequency. While a relaxation oscillator will ensure proper operation in some applications, other applications may require higher accuracy than the relaxation has been able to provide. There are heretofore unaddressed needs with previous RC oscillator solutions.

SUMMARY

Example embodiments of the present disclosure provide systems of oscillator frequency tuning using a bulk acoustic wave resonator. Briefly described, in architecture, one example embodiment of the system, among others, can be implemented as follows: a bulk acoustic wave (BAW) oscillator configured to produce a BAW oscillation signal at a first frequency; an adjustable oscillator configured to generate an adjustable oscillation signal at a second lower frequency, the second frequency adjustable based on input parameters; a frequency counter configured to count a number of pulses of the BAW oscillation signal in a number of periods of the adjustable oscillation signal; and an adjustment module configured to send an adjustment signal to the adjustment oscillator based on the count by the frequency counter.

Embodiments of the present disclosure can also be viewed as providing methods for oscillator frequency tuning using a bulk acoustic wave resonator. In this regard, one embodiment of such a method, among others, can be broadly summarized by the following steps: providing an adjustable oscillation signal at a first frequency; turning on a bulk acoustic wave (BAW) oscillation signal at a second higher frequency; counting pulses of the BAW oscillation signal during a number of periods of the adjustable oscillation signal; and adjusting the adjustable oscillation signal based on the count.

BRIEF DESCRIPTION OF THE DRAWINGS

FIG. 6 is a signal diagram for the wake up timing of an example embodiment of the system of oscillator frequency tuning using a bulk acoustic wave resonator of FIG. 3.

DETAILED DESCRIPTION

Embodiments of the present disclosure will be described more fully hereinafter with reference to the accompanying drawings in which like numerals represent like elements throughout the several figures, and in which example embodiments are shown. Embodiments of the claims may, however, be embodied in many different forms and should not be construed as limited to the embodiments set forth herein. The examples set forth herein are non-limiting examples and are merely examples among other possible examples.

Although a relaxation oscillator is used in explaining the example embodiments herein, an RC oscillator could be similarly used and adjusted. Relaxation oscillator and RC oscillators are similar in that the oscillation frequency is determined by an RC time constant. There are different architectures of relaxation oscillators but they are not limited for the calibration systems and methods disclosed herein, as long as the output of the clock signal is a square wave (for digital logic to accurately compute the "counts").

Example embodiments of the systems and methods of oscillator frequency tuning using bulk acoustic wave resonator improve the accuracy of oscillators without adding additional current and without relying on a crystal oscillator. Better accuracy may be achieved using resistance and capacitance components with very low power using the systems and methods disclosed herein. Although the relaxation oscillator consumes very low current, the temperature stability is poor. A bulk acoustic wave (BAW) oscillator is used to tune the output frequency when the oscillator varies over temperature.

Figure 1A:
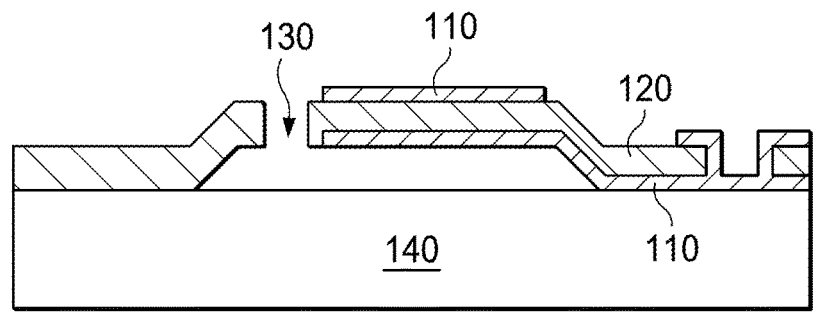
FIG. 1A is a perspective diagram of an example embodiment of a bulk acoustic wave (BAW) resonator.
Figure 1B:
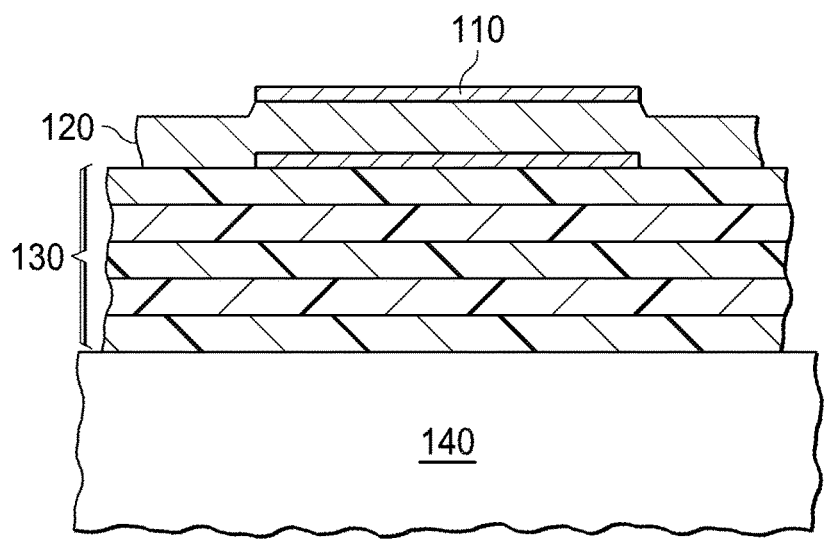
FIG. 1B is a perspective diagram of an example embodiment of a bulk acoustic wave resonator.

The basic element of a BAW oscillator is a thin film resonator as provided in FIG. 1A and FIG. 1B. Piezo-electric film 120 is sandwiched between two metal films 110. Reflector layers 130 may comprise alternating layers of differentiated acoustic velocity, ¼ wavelength in thickness, providing a reflectance approaching the performance of a free surface. Substrate 140 may be comprised of quartz, glass, alumina, sapphire, and silicon, among others. Key properties of the BAW resonator are set to store the maximum acoustic energy within the structure, achieving a high electrical Q. The boundary conditions outside of the metal films must maintain a very high level of acoustic reflection with vacuum being the ideal interface. BAW composition materials are chosen to optimize both electrical and mechanical properties.

Figure 2:
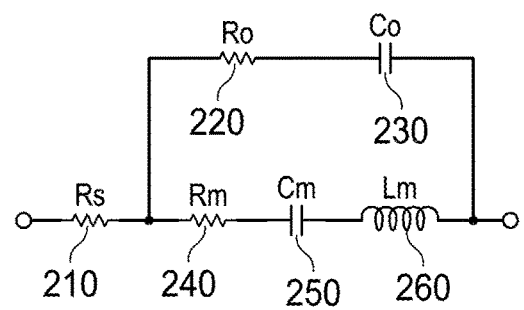
FIG. 2 is a circuit diagram of an example embodiment of a BAW equivalent circuit.

FIG. 2 provides a modified Butterworth-van Dyke (MBVD) model of a BAW resonator. Reactive elements $C_O$ 230, $C_M$ 250, and $L_M$ 260 describe the fundamental mode of the resonator, while resistors $R_S$ 210, $R_O$ 220, and $R_M$ 240 model various bulk, perimeter, and parasitic losses. Example model parameters are 0.77 ohms for $R_S$ 210, 0.26 ohms for $R_O$ 220, 0.47 ohms for $R_M$ 240, 3.73 pF for $C_O$ 230, 215.8 fF for $C_M$ 250, and 19.2 nH for $L_M$ 260.

Figure 3:
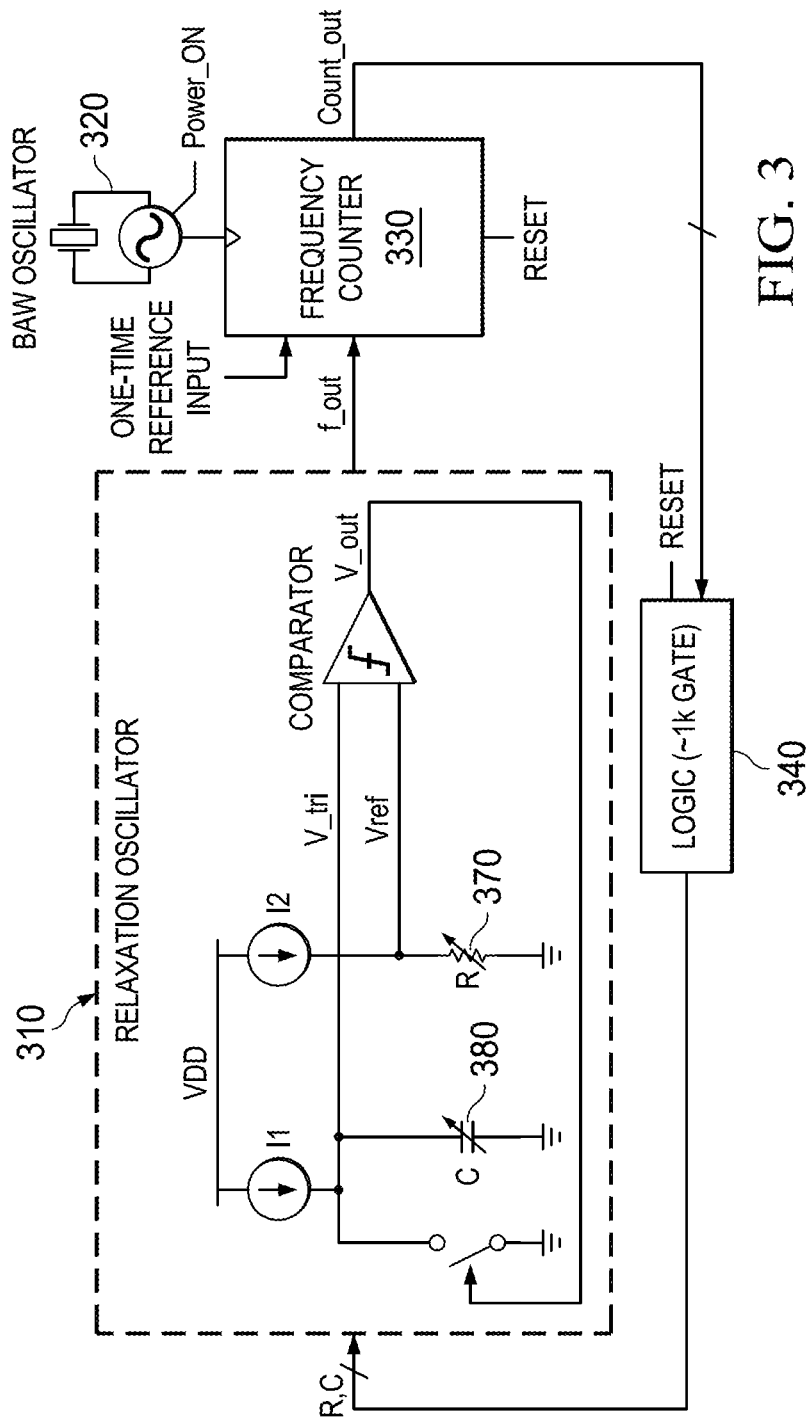
FIG. 3 is a system block diagram of an example embodiment of a system of oscillator frequency tuning using a bulk acoustic wave resonator.

FIG. 3 provides an example embodiment of the systems and methods of oscillator frequency tuning using bulk acoustic wave resonator including relaxation oscillator 310, BAW oscillator 320, frequency counter 330 and adjustment module 340. BAW oscillator 320 provides an accurate time reference even over temperature changes. BAW oscillator 320 is turned on periodically (for example, every 10 seconds) and relaxation oscillator 310 is calibrated with BAW oscillator 320. The temporary and periodic enablement of BAW oscillator 320 maintains a low current consumption.

In an example embodiment, frequency counter 330 counts a number of full periods of BAW oscillator 320 that occur in one period of relaxation oscillator 310. The oscillation frequency of BAW oscillator 320 may be selected as a multiple of the frequency of relaxation oscillator 310. Even if the frequencies do not divide evenly, the logic may count one less due to the truncation, which is acceptable since the count value is magnitudes higher. Since each frequency is known, the number of pulses of BAW oscillator 320 that should occur during one period of relaxation oscillator 310 is known. If the count is different from what should be counted, a correction may be made by adjusting an input parameter of relaxation oscillator 310. In an example implementation, BAW 320 is configured to run at 2.5 GHz and relaxation oscillator 310 is configured to run at 32 kHz. Dividing 2.5 GHz by 32 kHz results in 80,000 BAW clock pulses that should be counted during each period of relaxation oscillator 310.

In an example embodiment, counter 330 counts the cycles of BAW oscillator 320. If counter 330 counts 80,000 in the example from above, relaxation oscillator 310 is operating at the target frequency. However, when the temperature changes, for example, the frequency of relaxation oscillator 310 may change, resulting in a change in the count, for example, to 80,010. Since the count is off by 10 cycles, an adjustment may be made to correct relaxation oscillator 310 and obtain the target frequency.

BAW oscillator 320 consumes much higher current than relaxation oscillator 310. To minimize the current consumption, BAW oscillator 320 is turned on periodically, for example, every 10 seconds. Since the ambient temperature normally changes relatively slowly, for example, one degree every 20 seconds, relaxation oscillator 310 will only need to be corrected relative to the maximum temperature coefficient of the relaxation oscillator circuit. In an example implementation, BAW oscillator 320 is enabled with a duty cycle of $10^{-5}$. If BAW oscillator 320 consumes one milliamp if turned on full time, it consumes only 10 nA when turned on periodically with a $10^{-5}$ duty cycle.

In an example embodiment, the timing of the turn on for the BAW oscillator (the duty cycle) is configurable. The selection of the duty cycle of BAW oscillator 320 may be application dependent. The more rapid the temperature change of an application, the higher the duty cycle of BAW oscillator 320. In an example embodiment, a second frequency counter counts how many relaxation oscillation periods have occurred after the calibration period (when BAW oscillator 320 is enabled) and then turns BAW oscillator 320 on again. For example, BAW oscillator 320 is enabled for 10,000 cycles of relaxation oscillator 310.

Whereas a typical crystal oscillator may run in the MHz range, a typical BAW oscillator runs in the GHz range. The higher frequency improves the accuracy of the tuning of relaxation oscillator 310. In the example implementation above, during one 32 kHz clock period of relaxation oscillator 310, BAW oscillator 320 at 2.5 GHz produces 80,000 cycles. This is much more accurate than a crystal oscillator running at 25 MHz, for example, which is 100 times slower, producing only 800 counts per period of relaxation oscillator 310.

Adjustment module 340, which, in a hardware implementation, may include digital logic gates, performs the post processing. Relaxation oscillator 310 comprises, for example, resistors and capacitors, which determine the frequency. As the frequency changes over temperature, example embodiments of the systems and methods of oscillator frequency tuning using a bulk acoustic wave resonator adjust parameters such as the adjustable resistance 370, adjustable capacitance 380, and/or current source of relaxation oscillator 310 to tune the output frequency. In an example embodiment, adjustment module 340 converts the output of counter 330 to the corresponding oscillator parameter value. Adjustment module 340 sends out the appropriate control to adjust one or more parameters of relaxation oscillator 310.

Figure 3A:
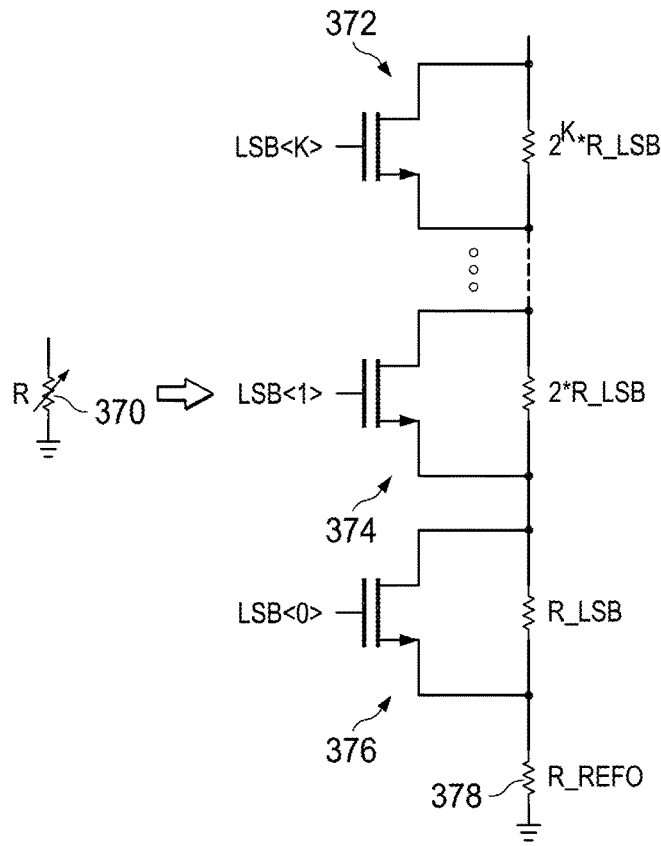
FIG. 3A is a circuit block diagram of an example embodiment of a variable resistor used in the system of FIG. 3.

FIG. 3A provides an example embodiment of adjustable resistor 370. A digital word with a k+1 bit resolution of the resistor ladder is sent from adjustment module 340 to relaxation oscillator 310. The bits are fed to transistors that switch the resistors in and out of the tree. The least significant bit is applied to branch 376, the next bit to branch 374, and so on up to the most significant bit applied to branch 372. The appropriate resistors are added in series with reference resistor 378 to achieve the desired resistance to adjust the output frequency of relaxation oscillator 310. This is but one way in which the resistance may be adjusted to affect the output frequency.

Figure 3B:
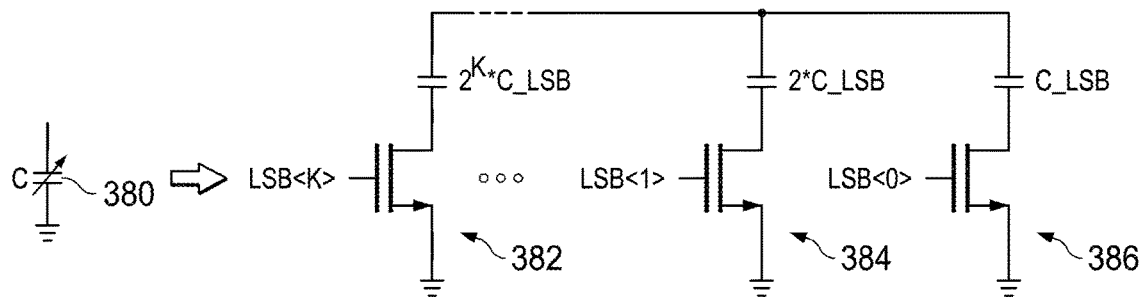
FIG. 3B is a circuit block diagram of an example embodiment of a variable capacitor used in the system of FIG. 3.

FIG. 3B provides an example embodiment of adjustable capacitor 380. A digital word with a k+1 bit resolution of the capacitor array is sent from adjustment module 340 to relaxation oscillator 310. The bits are fed to transistors that switch the capacitors in and out of the array. The least significant bit is applied to branch 386, the next bit to branch 384, and so on up to the most significant bit applied to branch 382. The appropriate capacitors are added in parallel to achieve the desired capacitance to adjust the output frequency of relaxation oscillator 310. This is but one way in which the capacitance may be adjusted to affect the output frequency.

Since the frequency of BAW oscillator 320 is in the GHz range, for example, 2.5 GHz, a one-count error may be a small as 12 parts per million of a relaxation oscillator 310 at 32.768 kilohertz. Example embodiments of the disclosed systems and methods may be applied to relaxation oscillator 310 configured to operate at any frequency. An example embodiment implements an open-loop architecture unlike a phase lock loop (PLL) in which the output frequency settling time is dependent on the PLL bandwidth.

In an example embodiment of the disclosed systems and methods, the output frequency of relaxation oscillator 310 is calibrated digitally once the difference in the counts is computed. Enabling BAW oscillator 320 only during the counting period saves power and benefits from a fast start up time as counting can only start after a startup time in which the output reaches a steady state. An example startup time for BAW oscillator 320 is in the order of a few microseconds (which is approximately 1,000 times faster than a typical crystal oscillator).

Figure 4:
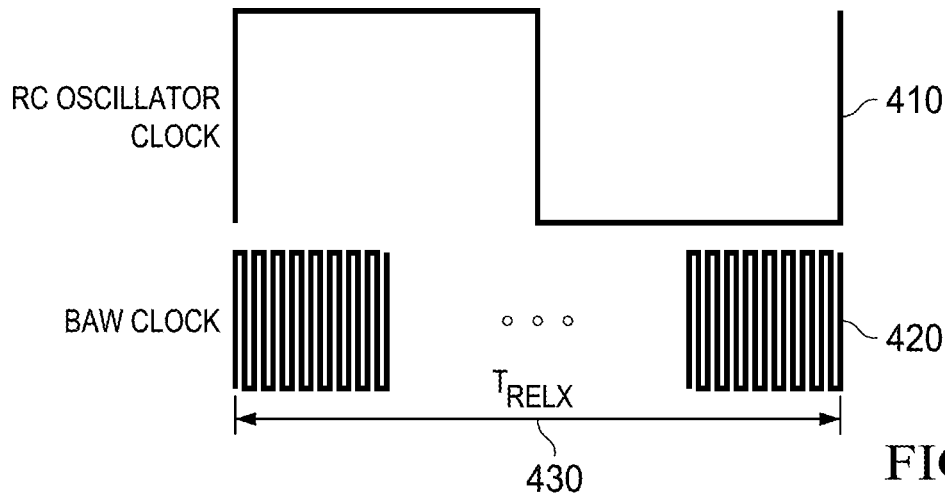
FIG. 4 is a signal diagram of an example embodiment of the output signals of the relaxation and BAW oscillators.
Figure 5:
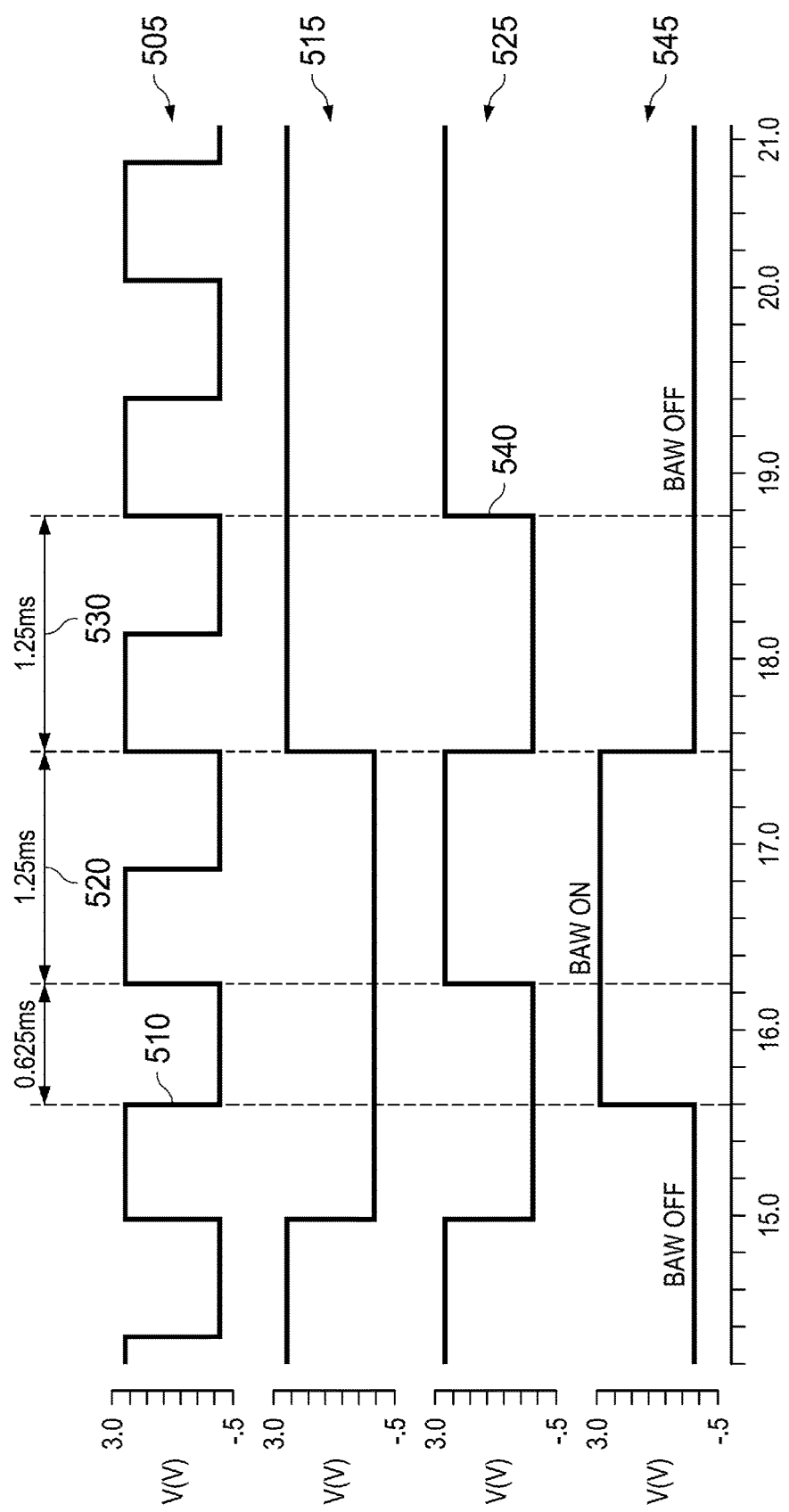
FIG. 5 is a signal diagram of a timing relationships used in an example embodiment of the system of oscillator frequency tuning using a bulk acoustic wave resonator of FIG. 3.

FIG. 4 provides a signal diagram detailing the relationship between relaxation oscillator signal 410 and BAW oscillator signal 420. In an example embodiment, the frequency of the BAW oscillator is selected to be a multiple of the frequency of the relaxation oscillator FIG. 5 provides a signal diagram of the timing involved in an example embodiment of the disclosed systems and methods. Signal 505 is the output of the relaxation oscillator. In this diagram, signal 505 is an 800 Hz square wave. Signals 515 and 525 describes the state of an example embodiment of adjustment module 340 (such as a finite state machine logic module) for which signal 515 an upper bit and 525 is a lower bit. The four states of the outputs determine the timing operation of the adjustment of relaxation oscillator 310. Signal 545 is the BAW enable signal.

In state 0 in which signal 515 is 0 and signal 525 is 0, the system is in a setup state. The digital block is prepared for an upcoming calibration. The BAW oscillator is turned on at falling edge 510 for startup and settling time of the BAW oscillator. It is turned on a half clock cycle before the count period to allow for the startup and settling time of the BAW oscillator. In state 1 in which signal 515 is 0 and signal 525 is 1, the system is in a calibration state. The number of BAW cycles is counted during period 520 and the BAW oscillator is turned off on the rising edge of period 520 of relaxation oscillator signal 505. In state 2 in which signal 515 is 1 and signal 525 is 0, the system is in a computation state. The BAW oscillator is turned off since the count has been determined, and an adjustment of the relaxation oscillator parameters is calculated to compensate for any frequency change during period 530. The relaxation oscillator parameter(s) may then be adjusted on rising edge 540 of control signal 525.

In state 3 in which signal 515 is 1 and signal 525 is 1, the system is an off state in which the BAW oscillator is turned off. The adjustment parameters have been applied to the relaxation oscillator. The off period of the BAW oscillator may last a configurable time period before the system changes to state 0 again. This may be repeated periodically, as non-limiting examples, every 5, 10, 20, or 40 seconds, among others, depending on the application environment.

In an example embodiment of the disclosed systems and methods, the calibration duty cycle may be in the order of 0.01%, depending on the rate of temperature change of the environment. FIG. 6 provides a method for determining how often a duty ratio controller may enable BAW oscillator 320 to perform the calibration. The output frequency accuracy may be defined by the application and the temperature variation is dependent on the environment of the application. If the temperature changes more quickly, then the calibration may be performed more frequently.

In the example implementation of FIG. 6, two curves, the accuracy of +/−200 ppm 640 and accuracy at +/−400 ppm 630 are included. The time between the calibrations is a function of the rate of temperature change. It is assumed in this graph that the relaxation oscillator will change 100 ppm per degree C. In order to achieve the accuracy of +/−400 ppm shown in curve 630, the temperature cannot change more than four degrees; otherwise, the frequency tolerance will be more than 400 ppm. If an accuracy of 200 ppm is targeted, the temperature cannot change by more than 2 degrees between calibrations or the 200 ppm tolerance will be exceeded. This defines the maximum time between the calibrations.

The time between calibrations also relates to the duty cycle rate of the BAW oscillator (the enable/disable duty cycle, signal 545), which contributes to the BAW oscillator average current consumption. Dashed lines 620 and 610 cut off at $10^{-4}$ and $10^{-5}$ duty cycles respectfully. For $10^{-4}$ duty cycle 620, the time between calibrations is approximately 15 seconds. If $10^{-4}$ duty cycle is adequate for the BAW oscillator current consumption, then the duty cycle turns the BAW oscillator on every 15 seconds. The maximum rate of change that the system can tolerate is found at the intersection of the curve occurs with either curve 630 or 640. For a $10^{-4}$ duty cycle and an accuracy of +/−200 ppm, since the temperature cannot change by more than 2 degrees per calibration, the intersection between the two curves results in approximately 0.18 degrees per second. This means the temperature cannot change more than 0.18 degrees per second or the variation will be more than 200 ppm within 15 seconds. The curves of FIG. 6 are only examples. For a specific system, the system specifications would be applied to the intersections to determine the maximum tolerable temperature change for a particular duty cycle and accuracy.

In an alternative embodiment, the counting method of calibrating the output frequency includes a correction due to a measured variation in the ambient temperature of the BAW oscillator and/or in the relaxation oscillator to produce a more accurate output frequency from the relaxation oscillator. The correction may be performed digitally with a temperature sensor present on the silicon die with the BAW oscillator (or externally near the BAW oscillator). The temperature sensor may send a digital output to the adjustment module to further define changes in the relaxation oscillator parameters. The digital change may parametrically change a capacitor, resistor or a derived parameter such as current or voltage in a stepped fashion corresponding to the digital input. These oscillator parameters may change its frequency. In an alternative embodiment, the temperature sensor has analog outputs that directly control the relaxation oscillator in an analog method (e.g changing currents or voltages used in the oscillator or changing a voltage controlled capacitor) to adjust for temperature variations of the BAW and/or the relaxation oscillator).

In an example embodiment, the BAW oscillator and the relaxation oscillator are both co-packaged and BAW is a bond wire design of experiments (DOE) flip chip co-packaged to a BAW oscillator on a main chip. By integrating the oscillators in the same package, accurate calibration may be achieved in one and a half cycles of the relaxation oscillator frequency. In an example embodiment, this co-packaging (next to each other, stacked, flip chip, etc.) achieves a BAW oscillator operating in the GHz range.

Figure 7:
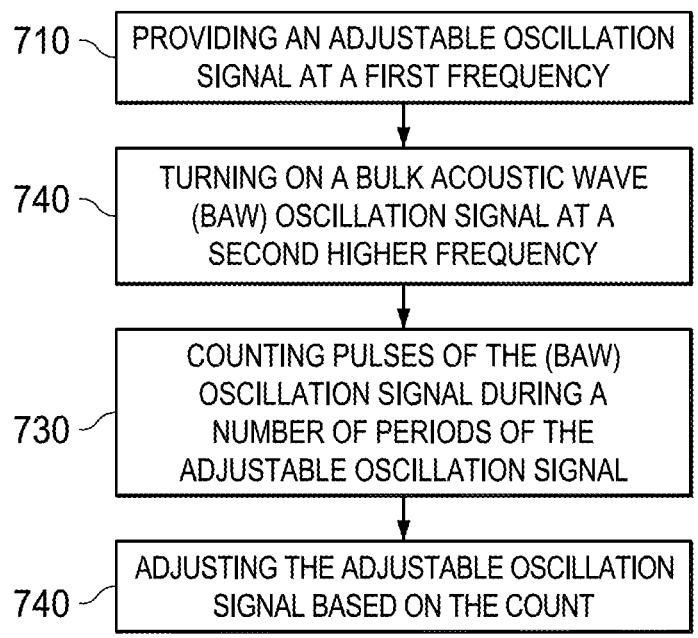
FIG. 7 is a flow diagram of an example embodiment of a method of oscillator frequency tuning using a bulk acoustic wave resonator.

FIG. 7 provides a flowchart of an example embodiment of a method of oscillator frequency tuning using a bulk acoustic wave resonator. In block 710, an adjustable oscillation signal is provided at a first frequency. In block 720, a bulk acoustic wave (BAW) oscillation signal is turned on at a second higher frequency. In block 730, pulses of the BAW oscillation signal are counted during a number of periods of the adjustable oscillation signal. In block 740, the adjustable oscillation signal is adjusted based on the count.

The flow chart of FIG. 7 shows the architecture, functionality, and operation of a possible implementation of the relaxation oscillator adjustment software. In this regard, each block represents a module, segment, or portion of code, which comprises one or more executable instructions for implementing the specified logical function(s). It should also be noted that in some alternative implementations, the functions noted in the blocks may occur out of the order noted in FIG. 7. For example, two blocks shown in succession in FIG. 7 may in fact be executed substantially concurrently or the blocks may sometimes be executed in the reverse order, depending upon the functionality involved. Any process descriptions or blocks in flow charts should be understood as representing modules, segments, or portions of code which include one or more executable instructions for implementing specific logical functions or steps in the process, and alternate implementations are included within the scope of the example embodiments in which functions may be executed out of order from that shown or discussed, including substantially concurrently or in reverse order, depending on the functionality involved. In addition, the process descriptions or blocks in flow charts should be understood as representing decisions made by a hardware structure such as a state machine.

The logic of the example embodiment(s) can be implemented in hardware, software, firmware, or a combination thereof. In example embodiments, the logic is implemented in software or firmware that is stored in a memory and that is executed by a suitable instruction execution system. If implemented in hardware, as in an alternative embodiment, the logic can be implemented with any or a combination of the following technologies, which are all well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc. In addition, the scope of the present disclosure includes embodying the functionality of the example embodiments disclosed herein in logic embodied in hardware or software-configured mediums.

Software embodiments, which comprise an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, or communicate the program for use by or in connection with the instruction execution system, apparatus, or device. The computer readable medium can be, for example but not limited to, an electronic, magnetic, optical, electromagnetic, infrared, or semiconductor system, apparatus, or device. More specific examples (a nonexhaustive list) of the computer-readable medium would include the following: a portable computer diskette (magnetic), a random access memory (RAM) (electronic), a read-only memory (ROM) (electronic), an erasable programmable read-only memory (EPROM or Flash memory) (electronic), and a portable compact disc read-only memory (CDROM) (optical). In addition, the scope of the present disclosure includes embodying the functionality of the example embodiments of the present disclosure in logic embodied in hardware or software-configured mediums.

Although the present disclosure has been described in detail, it should be understood that various changes, substitutions and alterations can be made thereto without departing from the spirit and scope of the disclosure as defined by the appended claims.

The invention claimed is:

1. A system comprising:
a bulk acoustic wave (BAW) oscillator configured to produce a BAW oscillation signal at a first frequency;
an adjustable oscillator configured to generate an adjustable oscillation signal at a second lower frequency, the second frequency adjustable based on input parameters;
a frequency counter configured to count a number of pulses of the BAW oscillation signal in a number of periods of the adjustable oscillation signal; and
an adjustment circuit configured to send an adjustment signal to the adjustment oscillator based on the count by the frequency counter.

2. The system of claim 1, wherein the adjustable oscillator comprises a relaxation oscillator with an output frequency that is adjustable by changing the value of at least one of a capacitance, a resistance, and a current source.

3. The system of claim 1, wherein the BAW oscillator is configured to be turned off after the adjustment of the adjustable oscillator.

4. The system of claim 1, wherein the BAW oscillator signal is configured to be on during a full period of the adjustable oscillation frequency.

5. The system of claim 1, wherein the BAW oscillation signal is configured to be turned on for at least one and a half adjustable oscillator oscillation periods, beginning in the middle of an adjustable oscillator oscillation period.

6. The system of claim 1, further comprising a temperature sensor configured to measure ambient temperature and send a digital signal to the adjustment circuit to modify the adjustment signal based on the measured ambient temperature.

7. The system of claim 1, wherein the BAW oscillator and the adjustable oscillator are included in a single semiconductor package.

8. A method, comprising:
providing an adjustable oscillation signal at a first frequency;
turning on a bulk acoustic wave (BAW) oscillation signal at a second higher frequency;
counting pulses of the BAW oscillation signal during a number of periods of the adjustable oscillation signal; and
adjusting the adjustable oscillation signal based on the count.

9. The method of claim 8, wherein adjusting the adjustable oscillation circuit comprises changing the value of at least one of a capacitance a resistance, and a current source.

10. The method of claim 8, further comprising turning off the BAW oscillator after the adjusting of the adjustable oscillation signal.

11. The method of claim 8, wherein turning on the BAW oscillation signal further comprises enabling the BAW oscillation signal during a full period of the adjustable oscillation signal.

12. The method of claim 8, further comprising turning on the BAW oscillation signal for at least one and a half adjustable oscillation signal periods, beginning at a periodic midpoint of an adjustable oscillation period.

13. The method of claim 8, wherein adjusting the adjustable oscillation signal further comprises switching in capacitors and resistors of an adjustable oscillator for generating the adjustable oscillation signal.

14. A circuit comprising:
a frequency counter configured to receive:
a first oscillation signal; and
a bulk acoustic wave (BAW) oscillation signal, wherein the frequency counter counts the cycles of the bulk acoustic wave oscillation signal during a period of the first oscillation signal; and
a logic circuit configured to adjust the first oscillation signal based on the count from the frequency counter.

15. The circuit of claim 14, further comprising a BAW oscillator configured to generate the BAW oscillation signal.

16. The circuit of claim 14, wherein the BAW oscillator is configured to be turned off after the adjustment of the adjustable oscillator.

17. The circuit of claim 14, further comprising a relaxation oscillator configured to generate the first oscillation signal.

18. The circuit of claim 17, wherein the relaxation oscillator is adjustable by changing the value of at least one of a capacitance, a resistance, and a current source.

19. The circuit of claim 14, further comprising a temperature sensor configured to measure ambient temperature and send a digital signal to the logic circuit to further modify the first oscillation signal based on the measured ambient temperature.

20. The circuit of claim 14, wherein the first oscillation signal and the BAW oscillation signal are generated in a single semiconductor package.

* * * * *